(12) United States Patent
Itoh

(10) Patent No.: US 7,060,519 B2
(45) Date of Patent: *Jun. 13, 2006

(54) MANUFACTURING METHOD FOR EXPOSURE MASK, GENERATING METHOD FOR MASK SUBSTRATE INFORMATION, MASK SUBSTRATE, EXPOSURE MASK, MANUFACTURING METHOD FOR SEMICONDUCTOR DEVICE AND SERVER

(75) Inventor: Masamitsu Itoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/756,347

(22) Filed: Jan. 14, 2004

(65) Prior Publication Data

US 2004/0146789 A1    Jul. 29, 2004

Related U.S. Application Data

(60) Continuation of application No. 10/355,215, filed on Jan. 31, 2003, now Pat. No. 6,727,565, which is a division of application No. 10/087,860, filed on Mar. 5, 2002, now Pat. No. 6,537,844.

(30) Foreign Application Priority Data

May 31, 2001    (JP)    .................................... 2001-164695

(51) Int. Cl.
*H01L 21/00*    (2006.01)

(52) U.S. Cl. ........................................... 438/48; 438/57
(58) Field of Classification Search .................. 438/48, 438/57, 30, 238, 514, 780; 355/55, 53
See application file for complete search history.

(56) References Cited

U.S. PATENT DOCUMENTS

| 4,391,511 | A |  | 7/1983  | Akiyama et al. |
| 4,475,223 | A |  | 10/1984 | Taniguchi et al. |
| 5,565,285 | A |  | 10/1996 | Takekuma et al. |
| 5,737,072 | A |  | 4/1998  | Emery et al. |
| 5,801,954 | A |  | 9/1998  | Le et al. |
| 5,804,336 | A |  | 9/1998  | Rolfson |
| 5,989,760 | A |  | 11/1999 | Mangat et al. |
| 6,040,096 | A |  | 3/2000  | Kakizaki et al. |
| 6,172,373 | B1 | * | 1/2001 | Hara et al. .................. 250/548 |
| 6,316,358 | B1 |  | 11/2001 | Shin |
| 6,335,791 | B1 |  | 1/2002  | Miyatake |
| 6,537,844 | B1 | * | 3/2003 | Itoh ............................ 438/48 |

FOREIGN PATENT DOCUMENTS

| JP | 2-160237   | 6/1990 |
| JP | 02-160347  | 6/1990 |
| JP | 05-241322  | 9/1993 |
| JP | 7-74088    | 3/1995 |
| JP | 11-194479  | 7/1999 |
| JP | 2003-50458 | 2/2003 |
| JP | 2004-46259 | 2/2004 |

* cited by examiner

*Primary Examiner*—David Nelms
*Assistant Examiner*—Thinh T Nguyen
(74) *Attorney, Agent, or Firm*—Finnegan, Henderson, Farabow, Garrett & Dunner, L.L.P.

(57) ABSTRACT

There is disclosed a manufacturing method for exposure mask, which comprises acquiring a first information showing surface shape of surface of each of a plurality of mask substrates, and a second information showing the flatness of the surface of each of mask substrates before and after chucked on a mask stage of an exposure apparatus, forming a corresponding relation of each mask substrate, the first information and the second information, selecting the second information showing a desired flatness among the second information of the corresponding relation, and preparing another mask substrate having the same surface shape as the surface shape indicated by the first information in the corresponding relation with the selected second information, and forming a desired pattern on the above-mentioned another mask substrate.

15 Claims, 6 Drawing Sheets

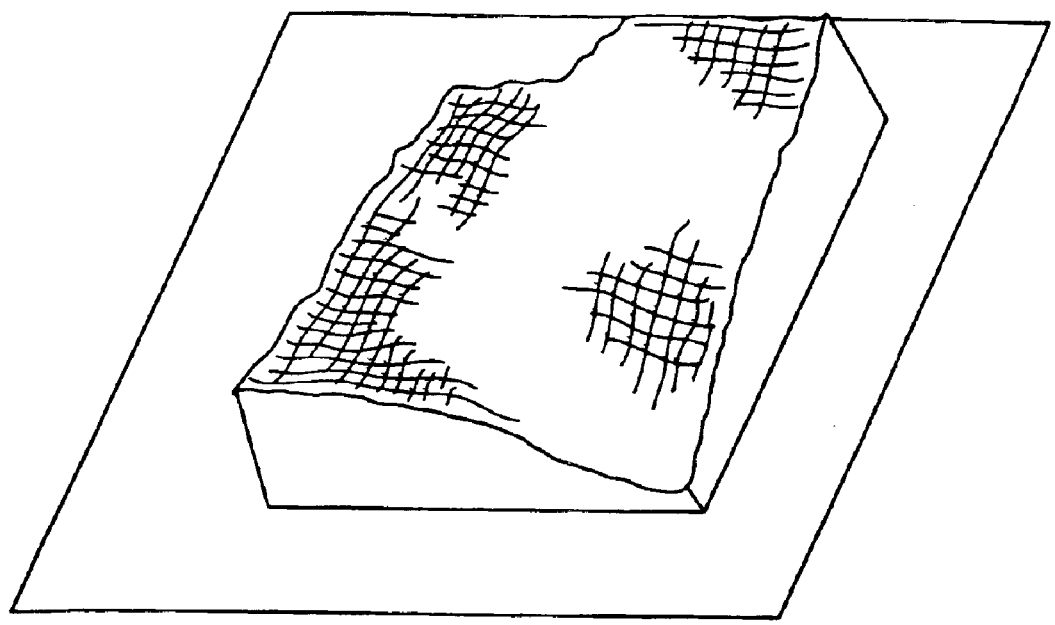
F I G. 3C
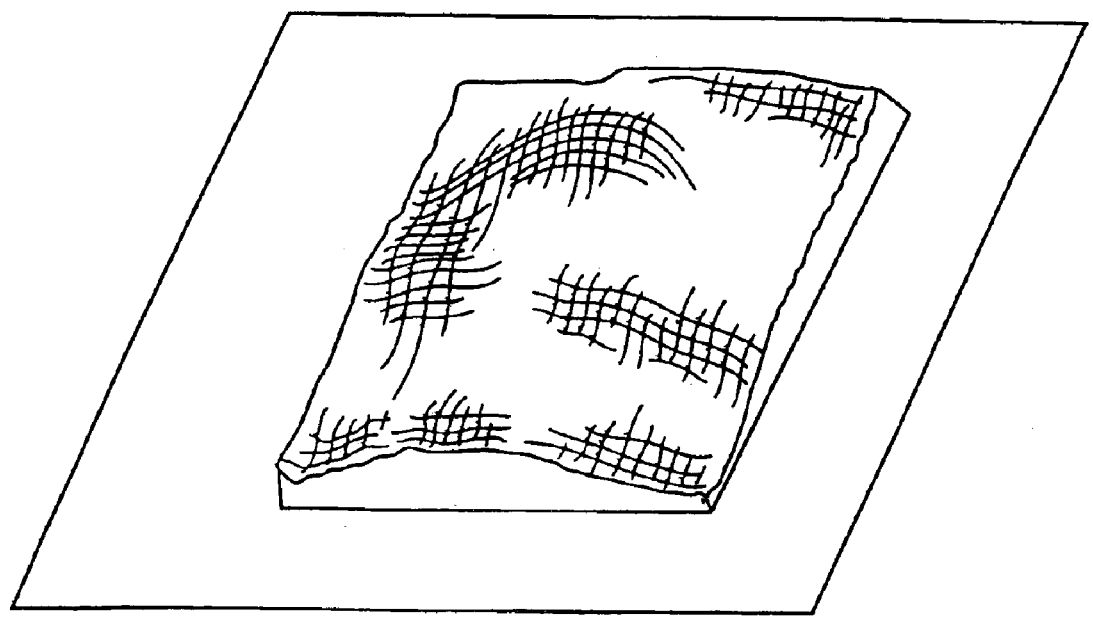
F I G. 3D

MANUFACTURING METHOD FOR EXPOSURE MASK, GENERATING METHOD FOR MASK SUBSTRATE INFORMATION, MASK SUBSTRATE, EXPOSURE MASK, MANUFACTURING METHOD FOR SEMICONDUCTOR DEVICE AND SERVER

CROSS-REFERENCE TO RELATED APPLICATIONS

This is a continuation of application Ser No. 10/355,215, filed Jan. 31, 2003 now U.S. Pat. No. 6,727,565, which is a divisional of application Ser. No. 10/087,860, filed Mar. 5, 2002 (now U.S. Pat. No. 6,537,844), both of which are incorporated herein by reference and from which the benefit under 35 U.S.C. § 120 is claimed. This application is also based upon and claims the benefit of priority from the prior Japanese Patent Application No. 2001-164695, filed May 31, 2001 the entire contents of which are incorporated herein by reference.

BACKGROUND OF THE INVENTION

1. Field of the Invention

The present invention relates to a manufacturing method for exposure mask in semiconductor field, a generating method for mask substrate information, a mask substrate, an exposure mask, a manufacturing method for a semiconductor device and server.

2. Description of Related Art

As the semiconductor devices are miniaturized, there is a demand for micronization in the photolithographic process. Already, the device design rule is as small as 0.13 µm, and the pattern dimension is about 10 nm and a very severe precision is requested. As a result, recently, problems are arising in photolithography in the semiconductor manufacturing process.

The problems are about flatness of mask substrate used in the photolithographic process as one of the factors relating to enhancement of precision in pattern forming process. That is, as the micronization is advanced, the margin for the focus in photolithography becomes smaller, and therefore the flatness of the mask substrate can be no longer ignored.

Accordingly, the present inventor accumulated studies about flatness of the mask substrate, disclosed the following.

Surface shapes of mask substrate are various, including, even in the same flatness, convex type, concave type, saddle type and mixed type. Therefore, even if the flatness is the same, when the mask substrate is fixed on the mask stage of a wafer exposure apparatus by vacuum chuck, the mask substrate may be largely deformed, or little deformed, or inversely the flatness of the mask substrate may be improved, depending on the conformity with the mask stage or vacuum chuck.

This is because the flatness of the mask substrate after chucked depends on the surface shape of the mask substrate before fixed, and also varies with the part of the mask substrate where the mask substrate is chucked by the vacuum chuck even in the same mask substrate. Depending on the surface shape of the mask substrate, the flatness of the mask substrate may be largely degraded by chucking the mask substrate on the mask stage of the wafer exposure apparatus.

It has become found that the product yield was lowered when semiconductor devices were manufactured by using an exposure mask obtained by forming a pattern on such mask substrate with low flatness.

The inventor compared the flatness of mask substrate before and after chucking the mask substrate on the mask stage of the wafer exposure apparatus, and confirmed that the flatness of the mask substrate was degraded after chucked depending on the surface shape of the mask substrate, and found that such degraded flatness was a major cause to lower the product yield.

BRIEF SUMMARY OF THE INVENTION

According to a first aspect of the present invention, there is provided a manufacturing method for exposure mask comprising:

acquiring a first information showing surface, shape of surface of each of a plurality of mask substrates, and a second information showing the flatness of the surface of each of mask substrates before and after chucked on a mask stage of an exposure apparatus;

forming a corresponding relation of each mask substrate, the first information and the second information;

selecting the second information showing a desired flatness among the second information of the corresponding relation, and preparing another mask substrate having the same surface shape as the surface shape indicated by the first information in the corresponding relation with the selected second information; and forming a desired pattern on the another mask substrate.

According to a second aspect of the present invention, there is provided a manufacturing method for exposure mask comprising:

selecting a second information showing a desired flatness among the second information of relations each between a first information showing a surface shape of a surface of each of a plurality of mask substrates and the second information showing a flatness of the surface of each mask substrate before and after chucked on a mask stage of an exposure apparatus, and preparing another mask substrate having the same surface shape as the surface shape indicated by the first information in the corresponding relation with the selected second information; and forming a desired pattern on the another mask substrate.

According to a third aspect of the present invention, there is provided a manufacturing method for exposure mask comprising:

acquiring information showing a surface shape of surface of each of a plurality of mask substrates;

forming a corresponding relation between each of the mask substrates and the information;

selecting the information showing a convex surface shape from the corresponding relation of the mask substrates, and selecting the mask substrate in the corresponding relation with the selected information from the plurality of mask substrates; and forming a desired pattern on the selected mask substrate.

According to a fourth aspect of the present invention, there is provided a generating method for mask substrate information comprising:

acquiring a first information showing a surface shape of surface of each of a plurality mask substrates, and a second information showing a flatness of the surface of each of the mask substrates before and after chucked on a mask stage of an exposure apparatus; and storing the first information and second information of each of the mask substrates in a corresponding relation.

According to a fifth aspect of the present invention, there is provided a generating method for mask substrate information comprising:

acquiring information showing a surface shape of a surface of each of a plurality of mask substrates; and storing the information showing a convex surface shape of the surface of each of a plurality of mask substrates from the acquired information and a corresponding mask substrate.

According to a sixth aspect of the present invention, there is provided a mask substrate comprising:

a substrate having a surface; and a light shielding material layer configured to cover the surface of the substrate, wherein a surface shape of a peripheral region of the surface of the substrate is lower in height than the surface of the central portion of the surface of the substrate toward a peripheral edge of the substrate.

According to a seventh aspect of the present invention, there is provided an exposure mask comprising:

a substrate having a surface; and a light shielding material pattern formed on the surface of the substrate, wherein a surface shape of a peripheral region is lower in height than a surface of a central region of the surface of the substrate toward a peripheral edge of the substrate.

According to an eighth aspect of the present invention, there is provided a manufacturing method for a semiconductor device comprising:

chucking an exposure mask manufactured by a manufacturing method for exposure mask according to the above-mentioned first aspect, on a mask stage of an exposure apparatus;

illuminating the pattern formed on the exposure mask by a lighting optical system, and focusing an image of the pattern on a layer formed on a substrate by a projecting optical system; and patterning the layer based on the image to form a corresponding pattern which forms a semiconductor device.

According to a ninth aspect of the present invention, there is provided a manufacturing method for a semiconductor device comprising:

chucking an exposure mask according to the above-mentioned seventh aspect on a mask stage of an exposure apparatus; and illuminating the pattern formed on the exposure mask by a lighting optical system, and focusing an image of the pattern on a layer formed on a substrate by a projecting optical system; and patterning the layer based on the image to form a corresponding pattern which forms a semiconductor device.

According to a tenth aspect of the present invention, there is provided a server comprising:

a processing device which processes storing a page including information showing a corresponding relation between a first information showing a surface shape of a surface of each of a plurality of mask substrates and the second information showing a flatness of the surface of each mask substrate before and after chucked on a mask stage of an exposure apparatus;

a processing device which processes accepting a request message corresponding to the page from a client;

a processing device which processes transmitting the page in a format displayable at the client side; and a processing device which processes accepting an application message of the mask substrate from the client having the page transmitted.

According to an eleventh aspect of the present invention, there is provided a manufacturing method for exposure mask comprising:

acquiring a first information showing a surface shape of a surface of each of a plurality of mask substrates, and a second information showing flatness of the surface of each of mask substrates after chucked on a mask stage of an exposure apparatus obtained by simulation on the basis of flatness of the surface of each of the mask substrates measured by a flatness measuring apparatus and a structure of a mask chuck of the exposure apparatus;

forming a corresponding relation of each mask substrate, the first information and the second information;

selecting the second information showing a desired flatness among the second information of the corresponding relation, and preparing another mask substrate having the same surface shape as the surface shape indicated by the first information in the corresponding relation with the selected second information; and forming a desired pattern on the another mask substrate.

According to a twelfth aspect of the present invention, there is provided a manufacturing method for exposure mask comprising:

selecting a second information showing a desired flatness among the second information of corresponding relations each between a first information showing a surface shape of a surface of each of a plurality of mask substrates and the second information showing flatness of the surface of each of mask substrates after chucked on a mask stage of an exposure apparatus obtained by simulation on the basis of flatness of the surface of each of the mask substrates measured by a flatness measuring apparatus and a structure of a mask chuck of the exposure apparatus, and preparing another mask substrate having the same surface shape as the surface shape indicated by the first information in the corresponding relation with the selected second information; and forming a desired pattern on the another mask substrate.

According to a thirteenth aspect of the present invention, there is provided a manufacturing method for exposure mask comprising:

acquiring a first information showing a surface shape of a surface of a mask substrate;

acquiring a second information showing flatness of the surface of the mask substrate after chucked on a mask stage of an exposure apparatus obtained by simulation on the basis of the surface shape of the surface of the mask substrate shown by the first information and a structure of a mask chuck of the exposure apparatus;

judging whether or not the flatness of the surface of the mask substrate is conformed to a specification; and processing the mask substrate to form an exposure mask if it is judged that the flatness is conformed.

BRIEF DESCRIPTION OF THE SEVERAL VIEWS OF THE DRAWING

FIG. 3C is a schematic perspective view of the surface of the mask substrate shown in FIG. 2A for explaining a further surface shape of the first region 1 of the surface of the mask substrate;

FIG. 3D is a schematic perspective view of the surface of the mask substrate shown in FIG. 2A, for explaining a still further surface shape of the first region 1 of the surface of the mask substrate;

DETAILED DESCRIPTION OF THE INVENTION

Figures 1, 4:
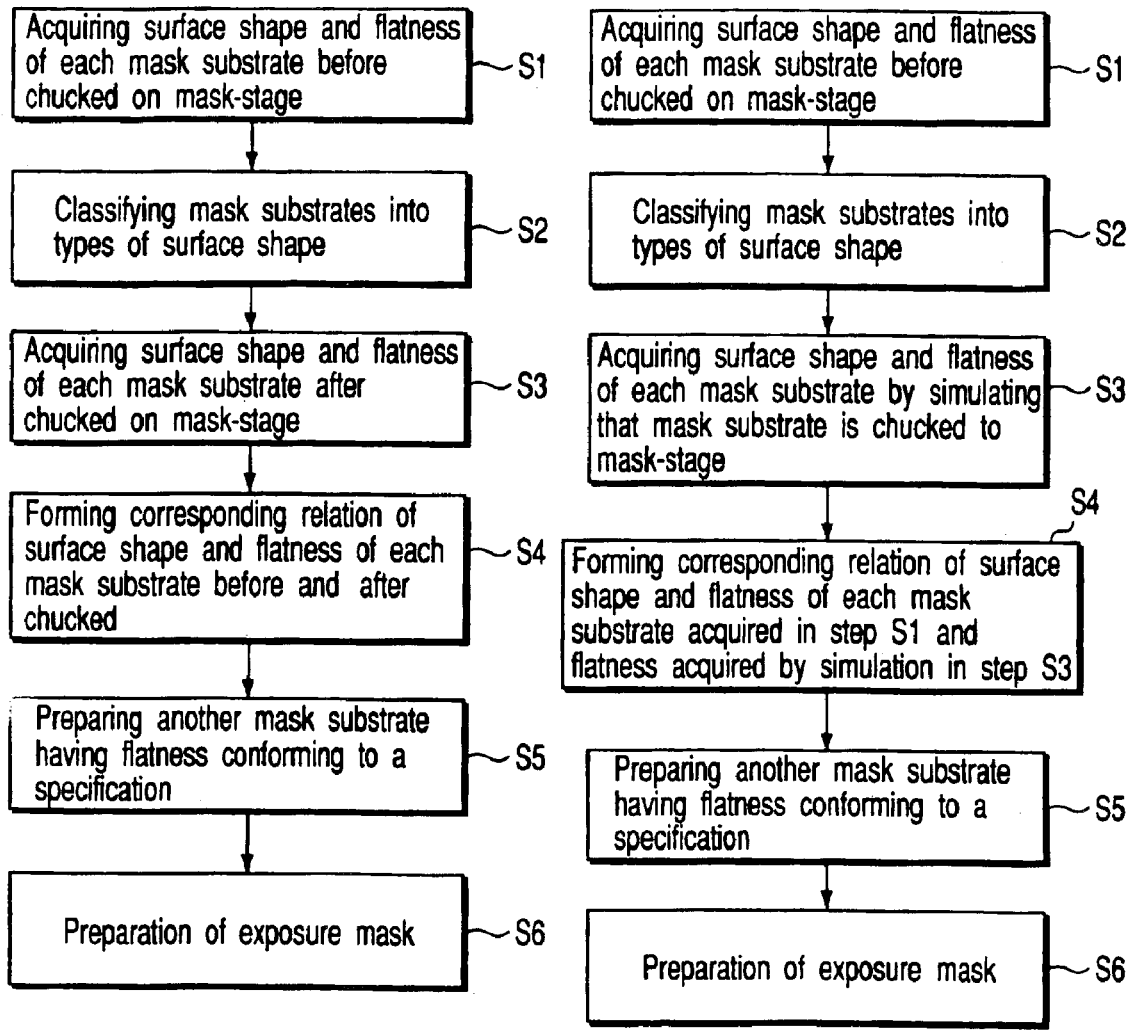
FIG. 1 is a flowchart showing the flow of a manufacturing method for an exposure mask according to a first embodiment of the present invention.
FIG. 4 is a flowchart showing the flow of a manufacturing method for an exposure mask according to a third embodiment of the present invention.

Referring now to the drawings, preferred embodiments of the present invention are described below.

(First Embodiment)

FIG. 1 is a flowchart showing the flow of a manufacturing method for exposure mask according to a first embodiment of the invention.

Eleven mask substrates A to K are prepared, each of which comprises a quartz substrate of 152 mm square and about 6 mm on which a light shielding material layer is formed to cover the quartz substrate.

A surface of each mask substrate is measured by a flatness measuring apparatus (Nidek), and a surface shape and flatness of the surface of each of the mask substrate before chucked on a mask stage of an exposure apparatus by vacuum chuck is obtained (step S1)

Figure 2A:
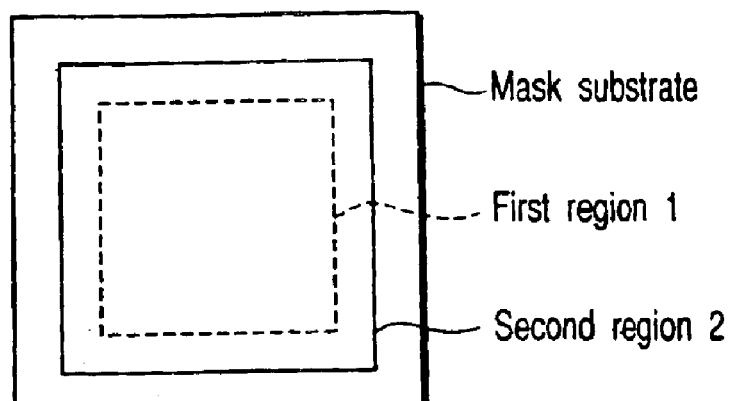
FIG. 2A is a plan view of a surface of a mask substrate, for explaining a first region 1 and a second region 2 of the surface of the mask substrate.

As shown in FIG. 2A, a first region 1 of 142 mm square was measured. The first region 1 is a pattern forming region in which a pattern or patterns are formed and excludes the peripheral region of the surface of the mask substrate.

Figure 2B:
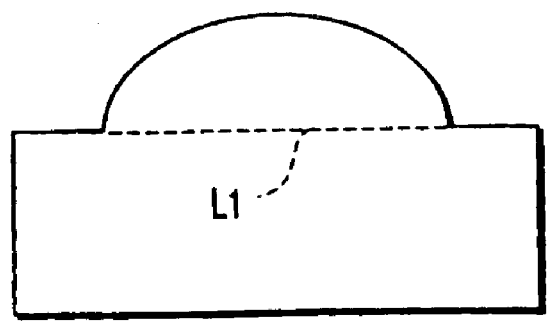
FIG. 2B is a schematic cross sectional view of the mask substrate shown in FIG. 2A, for explaining the cross section of the first region 1 of the mask substrate.
Figure 2C:
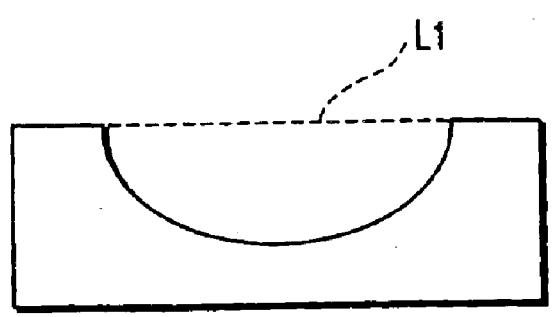
FIG. 2C is another schematic cross sectional view of the mask substrate shown in FIG. 2A, for explaining the cross section of the first region 1 of the mask substrate.
Figure 2D:
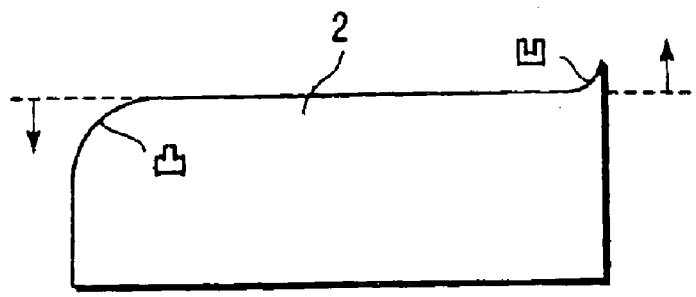
FIG. 2D is a schematic cross sectional view of the mask substrate shown in FIG. 2A, for explaining the cross section of the second region 2 of the mask substrate.
Figure 3A:
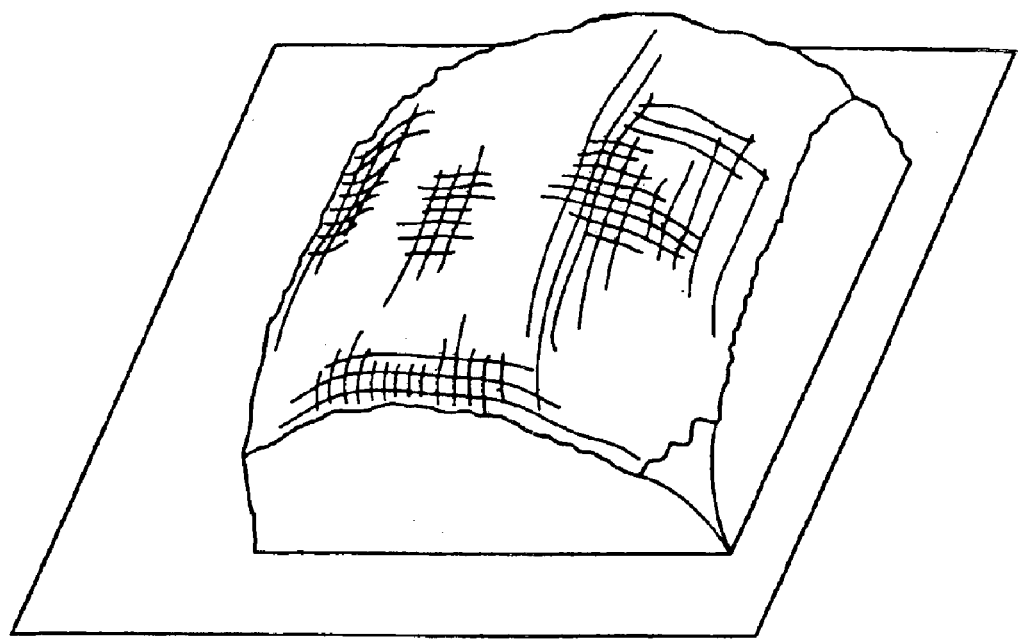
FIG. 3A is a schematic perspective view of the surface of the mask substrate shown in FIG. 2A, for explaining a surface shape of the first region 1 of the surface of the mask substrate.
Figure 3B:
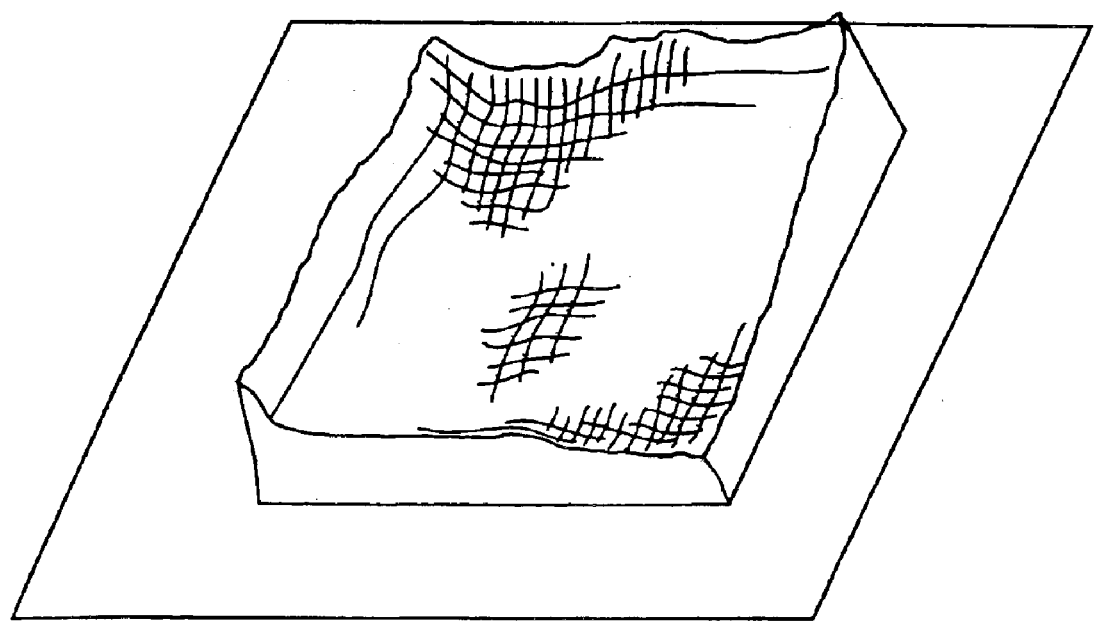
FIG. 3B is a schematic perspective view of the surface of the mask substrate shown in FIG. 2A, for explaining another surface shape of the first region 1 of the surface of the mask substrate.

In this embodiment and following embodiments, that the shape of the surface of the first region 1 is convex means that the shape of the surface of the first region 1 is convex upward from line L1 connecting the both ends of the first region 1, as shown in FIG. 2B. Similarly, that the shape of the surface of the first region 1 is concave means that the shape of the surface of the first region 1 is concave downward from line L1 connecting the both ends of the first region 1, as shown in FIG. 2C. FIG. 3A is a schematic perspective view of the surface of the mask substrate shown in FIG. 2A, in which a surface shape of the first region 1 of the surface of the mask substrate is convex upward, and FIG. 3B is a schematic perspective view of the surface of the mask substrate shown in FIG. 2A, in which a surface shape of the first region 1 of the surface of the mask substrate is concave downward;

Also, in this embodiment and following embodiments, that the shape of the surface of the second region 2 is convex means that the height of the surface of the second region 2 goes down toward the peripheral region of the surface of the mask substrate, as shown in FIG. 2D. Similarly, that the shape of the surface of the second region 2 is concave means that the height of the surface of the second region 2 goes up toward the peripheral region of the surface of the mask substrate, also as shown in FIG. 2D.

The second region 2 will be more described in a second embodiment of the present invention.

Following the flatness measurement step, on the basis of the obtained measurement result, the mask substrates A to K are classified into types of the surface shape of each of the mask substrates (step S2). The classified results are shown in Table 1. As shown in table 1, on the basis of the measurement result, the mask substrates were classified into four types (first information) of surface substrate thereof, that is, convex shape type, concave shape type, saddle shape type, and semi-cylindrical shape type. Measurements of flatness (second information) of the first region before fixed on the mask stage, i.e. before chucked by vacuum chuck, settled in a range of 0.4 μm to 0.5 μm.

TABLE 1

| Mask substrate | Flatness before chucked (μm) | Surface shape before chucked | Flatness after chucked (μm) |
| --- | --- | --- | --- |
| A | 0.5 | convex | 0.4 |
| B | 0.4 | convex | 0.4 |
| C | 0.45 | convex | 0.4 |
| D | 0.5 | concave | 0.8 |
| E | 0.5 | concave | 1.0 |
| F | 0.4 | saddle | 0.9 |
| G | 0.5 | saddle | 0.9 |
| H | 0.4 | semi-cylindrical | 0.4 |
| I | 0.5 | semi-cylindrical | 0.4 |
| J | 0.5 | semi-cylindrical (90-degree rotation) | 0.2 |
| K | 0.5 | semi-cylindrical (90-degree rotation) | 0.3 |

Next, the mask substrates are sequentially fixed by vacuum chuck on the mask stage of an ArF wafer exposure apparatus (Nikon), and the flatness of surface of each mask substrate after chucked by vacuum chuck is measured (step S3). Herein, the first region 1 of 142 mm square was measured. After the measurement step, the corresponding relation in each of the mask substrate A to K, of the type of surface shape and flatness before and after chucked by vacuum chuck, is tabled as shown in Table 1 (step S4).

As understood from Table 1, the flatness of the mask substrates A to C of the convex type surface shape after chucked is same or slightly better as compared with that before chucked, however in the mask substrates D to G of concave or saddle type surface shape after chucked, the flatness was notably degraded.

The mask substrates H and I of the semi-cylindrical type surface shape were arranged on the mask stage in a predetermined direction with regard to the chuck. On the other hand, the mask substrates J and K of the semi-cylindrical type surface shape were arranged on the mask stage in a direction changed by an angle of 90 degree from the predetermined direction so that the portion of the mask substrate to be chucked is changed.

It was found from the measurement result that the flatness of semi-cylindrical type mask substrates H to K after chucked is changed depending on the direction in which the mask substrates are arranged with regard to the chuck, as shown in Table 1.

In other words, it was found from the measurement result that the flatness of semi-cylindrical type mask substrates H to K after chucked is changed depending on the part of the mask substrate where the mask substrates are chucked by vacuum chuck.

More specifically, it was found from the measurement result that when the mask substrates, as in mask substrates H and I, of the semi-cylindrical type surface shape were arranged on the mask stage in the predetermined direction, then the side of arc of the mask substrate contacts a chuck of the mask stage and thus the flatness of the mask substrates after chucked is same or slightly better as compared with that before chucked. On the other hand, it was found from the measurement result that when the mask substrates, as in mask substrates J and K, of the semi-cylindrical type surface shape were arranged on the mask stage in a direction changed by an angle of 90 degree from the predetermined direction, then the side of the arc of the mask substrate does not contact the chuck of the mask stage and thus the flatness of the mask substrates after chucked is 0.3 µm or less and greatly improved. In the mask substrates A to G of other surface shapes, no measurement data when the mask substrates A to G are arranged in the angle of 90 degree changed direction is listed in Table 1 because it was found that the flatness was not improved in the change of angle of 90 degree.

From the mask substrates A to K in which the surface shape and flatness of the first region 1 before and after chucked by vacuum chuck have been already acquired, a mask substrate having the flatness conforming to the specification is selected and another mask substrate having the same types of surface shape as the selected substrate is prepared (step S5). Here, an example in which a mask substrate having the same type of surface shape as mask substrate J is prepared as the prepared another mask substrate is explained.

These mask substrates A to K and the prepared another mask substrate are formed so that the flatness in the pattern forming region may settle within the prescribed specification, and the difference in the surface shape is due to fluctuations.

Next, a resist is applied on the prepared another mask substrate.

After that, the known manufacturing method for exposure mask follows. That is, a desired pattern is drawn on the resist layer on the mask substrate by using an electron beam drawing apparatus. By developing the resist layer, a resist pattern is formed, and using the resist pattern as a mask, a light shielding pattern is formed by etching the light shielding material layer on the substrate by a reactive ion etching apparatus. Then the resist pattern is removed, and the mask substrate surface is cleaned, and an exposure mask having a desired pattern is realized (step S6). The desired pattern includes, for example, a circuit pattern, or a circuit pattern and a positioning pattern.

The exposure mask thus obtained was set on the ArF wafer exposure apparatus, and the flatness of the surface was measured, and a favorable value of 0.2 µm was confirmed. Thus, by performing an exposure method in which the exposure mask of such high flatness is fixed on the mask stage of the exposure apparatus, the pattern formed on the exposure mask is illuminated by a lighting optical system, and the pattern image is focused on a desired substrate (for example, a resist coated substrate) by a projection optical system, the margin of focus in wafer exposure is remarkably increased, and the yield of semiconductor products such as DRAM is substantially enhanced.

In this manner, this embodiment realizes an effective manufacturing method for exposure mask in order to solve the disadvantage of degradation of product yield due to degradation of flatness of mask substrate after chucked on the mask stage of the wafer exposure apparatus.

The mask substrates A to K, or the prepared another mask substrate may have a positioning mark formed in advance. Manner for chucking the mask substrate on the mask stage is not limited to vacuum chuck.

(Second Embodiment)

In the first embodiment, the surface shape and flatness are acquired only in the first region 1 of the surface of the mask substrate shown in FIG. 2A (step S1), however in this second embodiment, the surface shape and flatness are acquired both in the first region 1 and second region 2 of the surface of the mask substrate shown in FIG. 2A.

The first region 1 is a rectangular area of 142 mm in length of one side, whose center is substantially the center of the surface of the mask substrate, and the second region 2 surrounds the first region 1 and is a mouth-like or ring-like square region (i.e., a region excluding a smaller rectangular region from a rectangular region, with the center of the rectangular regions being the same) of 150 mm in length of one side. The second region 2 includes almost of the mask chucking region to be fixed by vacuum chuck when setting the mask substrate on an exposure apparatus. That is, almost all of a force for chucking the mask substrate on the mask stage is applied to the second region 2.

As an advancement from the prior art, when taking also the flatness of the mask chuck region into consideration, the first region 1 would be expanded, and the flatness of the expanded first region 1 including the mask chuck region would be taken into consideration.

In the ordinary mask manufacturing technology, however, it is extremely difficult to form the entire surface of the mask substrate flat, and in practice the flatness of the surface of the mask substrate 1 is extremely degraded at the end portion. Hence, if the first region 1 is expanded, the measured data of. flatness of the mask substrate is lowered, since the flatness of the end portion of the mask substrate 1 is poor, though the flatness of the central part of the mask substrate is good.

In this embodiment, accordingly, the flatness and the surface shape are acquired, in both the first region 1 including the center part of the mask substrate and the second region 2 surrounding the first region 1.

The surface shape of the surface of the mask substrate comprising a light shielding material layer on a quartz substrate of 152 mm square and about 6 mm in thickness was measured by a flatness measuring instrument (Nidek), and thirteen mask substrates A to M different from each other in the flatness and surface shape of the first region and flatness and surface shape of the second region were prepared.

These thirteen mask substrates A to M were sequentially set to the ArF wafer exposure apparatus (Nikon), and the flatness and the surface shape of both the first region 1 and the second region 2 were measured after chucked by vacuum chuck.

Next, a corresponding relation of the type of surface shape and flatness before and after chucked by vacuum chuck is made for each of the mask substrates A to M. The relation is listed in Table 2.

TABLE 2

| Mask substrate | First region (before chucked) | | Second region (before chucked) | | First region (after chucked) |
|---|---|---|---|---|---|
| | Flatness (μm) | Surface shape | Flatness (μm) | Surface shape | Flatness (μm) |
| A | 0.3 | convex | 4 | convex | 0.3 |
| B | 0.3 | convex | 3 | concave | 1.5 |
| C | 0.35 | convex | 4 | semi-cylindrical | 0.6 |
| D | 0.35 | convex | 4 | semi-cylindrical (90-degree rotation) | 0.3 |
| E | 0.35 | convex | 4 | saddle | 1.0 |
| F | 0.35 | concave | 4 | convex | 0.3 |
| G | 0.35 | concave | 4 | convex | 0.8 |
| H | 0.35 | concave | 4 | semi-cylindrical | 0.8 |
| I | 0.35 | concave | 4 | semi-cylindrical (90-degree rotation) | 0.4 |
| J | 0.35 | concave | 4 | saddle | 0.9 |
| K | 0.5 | saddle | 3 | saddle | 1.0 |
| L | 0.5 | semi-cylindrical | 3 | semi-cylindrical | 0.9 |
| M | 0.4 | semi-cylindrical | 3 | semi-cylindrical (90-degree rotation) | 0.4 |

The surface shape of the first and second regions of the thirteen mask substrates A to M were classified into four types, that is, convex type, concave type, saddle type, and semi-cylindrical type. In the mask substrate A of the simple convex shape, the surface shapes of the first region 1 and the second region 2 were both convex. In the mask substrate B shaped like brimmed hat, the surface shape was convex in the first region 1 and concave in the second region 2.

As listed in Table 2, the mask substrates degraded in surface shape of the first region 1 before and after chucked by vacuum chuck are those having the second region 2 in the convex and saddle type surface shape. The mask substrates C, D, H, I, L, and M having semi-cylindrical type surface shape indicated different results depending on the direction in which the mask substrates are arranged on the mask stage.

More specifically, it was found from the measurement result that when the mask substrates of the semi-cylindrical type surface shape were arranged on the mask stage in the predetermined direction, then the side of arc of the mask substrate contacts a chuck of the mask stage and thus the flatness of the mask substrates after chucked is degraded as compared with that before chucked. On the other hand, it was found from the measurement result that when the mask substrates of the semi-cylindrical type surface shape were arranged on the mask stage in a direction changed by an angle of 90 degree from the predetermined direction, then the side of the arc of the mask substrate does not contact the chuck of the mask stage and thus the flatness of the mask substrates after chucked is 0.4 μm or less and the flatness of almost of the mask substrates are improved.

The flatness of the first region 1 after chucked by vacuum chuck was confirmed to be nearly in no relation to the surface shape of the first region 1 before chucked. That is, the change of the surface shape of the mask substrate before and after chucked by vacuum chuck is determined mostly by the surface shape of the second region 2.

Further, although the flatness of the second region 2 is greatly lower than the flatness of the first region 1, in the case where the surface shape of the second region 2 is convex, the surface shape of the first region 1 of the mask substrate is hardly changed after chucked by vacuum chuck.

Hence, for each of the plural mask substrates, by forming the corresponding relation between the type of surface shape of the first region 1 and the second region 2 and the flatness before and after chucked by vacuum chuck, it becomes unnecessary to extend the first region 1 of the mask substrate more than necessary in order to determine the flatness of the mask chuck region, and the flatness of the first region is not required to be stricter than necessary and may be set at a realistic value. Further by taking the surface shape of the second region 2 into consideration, a mask substrate smaller in change of flatness before and after chucked by vacuum chuck can be more securely selected.

From the mask substrates A to M in which the types of surface shape and flatness of the first region 1 and the second region 2 before and after chucked by vacuum chuck have been already acquired, a mask substrate having the flatness conforming to the specification is selected and another mask substrate having the same types of surface shape as the selected substrate is prepared (step S5). Here, a mask substrate having the same type of surface shape as mask substrate F (concave in first region 1 and convex in second region 2) is prepared as the prepared another mask substrate. When this another mask substrate was measured, the flatness of the first region 1 was 0.3 μm or less and the flatness of the second region 2 was 4 μm or less.

Next, a resist is applied on the flesh mask substrate.

After that, the known manufacturing method for exposure mask follows. That is, a desired pattern is drawn on the resist layer on the mask substrate by using an electron beam drawing apparatus. By developing the resist layer, a resist pattern is formed, and using the resist pattern as a mask, a light shielding pattern is formed by etching the light shielding material layer on the substrate by a reactive ion etching apparatus. Then the resist pattern is removed, and the mask substrate surface is cleaned, and an exposure mask having a desired pattern is realized. The desired pattern includes, for example, a circuit pattern, or a circuit pattern and a positioning pattern.

The exposure mask thus obtained was set on the ArF wafer exposure apparatus, and the flatness of the first region 1 was measured, and a favorable value of 0.2 μm was confirmed. Thus, by performing an exposure method in which the exposure mask of such high flatness is fixed on the mask stage of the exposure apparatus, the pattern formed on the exposure mask is illuminated by a lighting optical system, and the pattern image is focused on a desired substrate (for example, a resist coated substrate) by a projection optical system, the margin of focus in wafer exposure is remarkably increased, and the yield of semiconductor products such as DRAM is substantially enhanced.

In this manner, as with the first embodiment, this embodiment realizes an effective manufacturing method for exposure mask in order to solve the disadvantage of degradation of product yield due to degradation of flatness of mask substrate after chucked on the mask stage of the wafer exposure apparatus.

The mask substrates A to M, or the prepared another mask substrate may have a positioning mark formed in advance. Manner for chucking the mask substrate on the mask stage is not limited to vacuum chuck.

As understood from Table 2, in the case of convex surface shape of the second region 2, the flatness of the first region 1 after chucked by vacuum chuck is excellent, and hence a mask substrate or exposure mask having a convex surface shape of the second region may be prepared and used.

The mask substrate or exposure mask having such surface shape in the second region can be obtained, for example, by making use of the fact that the polishing rate is higher in the central region (inside region) of a quartz substrate than in the peripheral region thereof. Specifically, it is obtained by polishing the surface of the quartz substrate longer than in conventional by using a polishing device. Thereafter, according to the known method, a light shielding film is formed to form a mask substrate, and then patterning of the light shielding film is performed to form an exposure mask.

Thus, as with the first embodiment, by performing an exposure method in which the exposure mask having the second region 2 with the predetermined surface shape (concave shape in the example) is fixed oh the mask stage of the exposure apparatus, the pattern formed on the exposure mask is illuminated by a lighting optical system, and the pattern image is focused on a desired substrate (for example, a resist coated substrate) by a projection optical system, the margin of focus in wafer exposure is remarkably increased, and the yield of semiconductor products such as DRAM is substantially enhanced.

Conventionally, in order to form the entire surface as flat as possible, the quartz substrate was polished. However, in order to make the difference in polishing rate less distinctive, it was not controlled to extend the polishing time longer. Therefore, if the surface shape of the second region becomes convex or concave due to fluctuation in polishing, its degree is obviously smaller than that of the mask substrate or exposure mask obtained by this embodiment.

(Third Embodiment)

In this embodiment, surface shapes of the surfaces of mask substrates corresponding to surface shapes of the surfaces of mask substrates after actually chucked by vacuum chuck are acquired by utilizing a simulation.

First, the surface shape of the surface of each of the mask substrates formed of a light shielding material layer on a quartz substrate of 152 mm square in size and about 6 mm in thickness was determined by measuring the flatness of the first region 1 (FIG. 2A) using the flatness measuring apparatus (Nidek), and thirteen mask substrates A to M different from each other in the flatness and surface shape were prepared.

Next, on the basis of the structure of the mask chuck of the ArF wafer exposure apparatus (Nikon) and the flatness of the surfaces of the mask substrates A to M already acquired, the surface shape of the surface of each of the mask substrates A to M at the time when the mask substrates A to M were sequentially fixed on the mask stage of the ArF wafer exposure apparatus by the vacuum chuck using a finite element method were acquired by utilizing a simulation. The finite element method may be replaced with any analytical method.

Subsequently, in order to confirm whether or not the simulation result is satisfied, the mask substrates A to M were actually and sequentially fixed on the above-described ArF wafer exposure apparatus by vacuum chuck, and the surface shape of the surface of each of the respective mask substrates after chucked by the vacuum chuck were measured. As a result, it was confirmed that as indicated in Table 3, in almost all of the mask substrates A to M, there is only the difference of 0.1 μm or less between the flatness of the surface of each of the mask substrates A to M obtained by the simulation and the flatness of the surface of each of the mask substrates A to M obtained by the measurement using the above-mentioned flatness measuring apparatus on which these mask substrates A to M have been actually set.

TABLE 3

| Mask substrate | Measurement data of mask substrate surface | | Flatness by simulation | Flatness after chucked |
|---|---|---|---|---|
| | Flatness (μm) | Surface shape | Flatness (μm) | Flatness (μm) |
| A | 0.3 | convex | 0.3 | 0.3 |
| B | 0.3 | convex | 1.5 | 1.5 |
| C | 0.35 | convex | 0.6 | 0.6 |
| D | 0.35 | convex | 0.3 | 0.3 |
| E | 0.35 | convex | 1.0 | 1.0 |
| F | 0.35 | concave | 0.5 | 0.3 |
| G | 0.35 | concave | 0.7 | 0.8 |
| H | 0.35 | concave | 0.8 | 0.8 |
| I | 0.35 | concave | 0.5 | 0.4 |
| J | 0.35 | concave | 0.9 | 0.9 |
| K | 0.5 | saddle | 1.3 | 1.0 |
| L | 0.5 | semi-cylindrical | 0.9 | 0.9 |
| M | 0.4 | semi-cylindrical | 0.4 | 0.4 |

This indicates that, upon preparing the corresponding relationship between the surface shape and the flatness each of the mask substrates before and after chucked the mask substrates by vacuum chuck, the flatness after the fixation by vacuum chuck can be replaced with the flatness acquired by the simulation.

From this result, it was understood that it is capable of predicting the surface shapes of the surfaces of the mask substrates at the time when the mask substrates have been actually set on the wafer exposure apparatus, by first measuring the flatness and the surface shape of the surface of each of the mask substrates before chucking the mask substrates by using the flatness measuring apparatus (Nidek) and then simulating the surface shapes of the surfaces of the mask substrates at the time when the mask substrates were sequentially fixed on the mask stage of the exposure apparatus by the vacuum chuck, on the basis of the flatness of the surface of each of the mask substrates already acquired by the flatness measuring apparatus and the mask chuck structure of the exposure apparatus. Thus, the flatness and the surface shape of the surface of each of the mask substrates can be controlled with a remarkably higher precision comparing to the conventional ones.

FIG. 4 is a flowchart showing the flow of a method of manufacturing an exposure mask pertaining to the third embodiment of the present invention. In the flowchart of FIG. 4, in the Step S3, the surface shape of the surface of each of the mask substrates at the time when the mask substrates have been fixed by the vacuum chuck are acquired by utilizing a simulation. Then, in the Step S4, the corresponding relationship between the flatness and the surface shape of each of the mask substrate acquired using the flatness measuring apparatus and the flatness and the surface shape of each of the mask substrate acquired by utilizing the simulation is prepared. Referring to the Steps S1, S2 and S5 to S6, these Steps are similar to the Steps of the flowchart of FIG. 1.

Next, in step S5, another mask substrate whose surface shape of the surface has been measured by the flatness measuring apparatus and whose surface shape of the surface at the time when the mask substrate has been fixed on the mask stage of the exposure apparatus by the vacuum chuck has been determined to be 0.2 μm by utilizing the simulation, was prepared besides the above-described mask substrates A to M.

Next, at step S6, resist was coated on the prepared another mask substrate.

And then, the processes of manufacturing an exposure mask by the well known methods are followed. Specifically, a desired pattern is depicted on the resist on the prepared another mask substrate by an electron beam depicting apparatus. Subsequently, the resist is developed to form a resist pattern, and next, with the resist pattern being made as a mask, a light shielding material pattern (mask pattern) is formed by patterning the light shielding material layer of the mask substrate by using a reactive ion etching apparatus. Then, the resist pattern is removed, subsequently, the washing of the mask substrate surfaces is performed, and an exposure mask on which the desired mask pattern has been formed is completed. When this exposure mask was actually set on the ArF wafer exposure apparatus and the surface shape of the surface and the flatness of the flesh mask substrate was measured using the flatness measuring apparatus, it was confirmed that the flatness is 0.2 μm as simulated and it is excellent flatness. Thus, by performing an exposure method in which the exposure mask of such high flatness is fixed on the mask stage of the exposure apparatus, the pattern formed on the exposure mask is illuminated by a lighting optical system, and the pattern image is focused on a desired substrate (for example, a resist coated substrate) by a projection optical system, the margin of focus in wafer exposure is remarkably increased, and the yield of semiconductor products such as DRAM is substantially enhanced.

In this manner, as with the first embodiment and the second embodiment, this embodiment realizes an effective manufacturing method for exposure mask in order to solve the disadvantage of degradation of product yield due to degradation of flatness of mask substrate after chucked on the mask stage of the wafer exposure apparatus.

The mask substrates A to M, or the prepared another mask substrate may have a positioning mark formed in advance. Manner for chucking the mask substrate on the mask stage is not limited to vacuum chuck.

In the respective embodiments described above, for example, the wafer exposure apparatus may not be an ArF wafer exposure apparatus. Moreover, after the formation of a mask pattern, the flatness of the surfaces of the mask substrates may be further measured, and the surface shapes of the surfaces of the mask substrates at the time when the mask substrates have been set on the exposure apparatus may be acquired by utilizing the simulation based on the measured data. Owing to this, the deformations of the surfaces of the mask substrates generated at the time when the mask patterns have been formed are incorporated into the acquisition results performed by the simulation, therefore, the surface shapes of the surfaces of the mask substrates are capable of being detected with a higher precision. Furthermore, the mask is not limited to a mask for ArF and a mask for KRF, for example, it can be also applied as a reflector type mask for vacuum ultraviolet ray exposure, a mask for x-ray exposure, a mask for electron beam exposure or the like.

(Fourth Embodiment)

In this embodiment, the surface shape of the surface of a mask substrate corresponding to the surface shape of the surface of the mask substrate after actually chucked by a vacuum chuck are acquired by utilizing a simulation.

Figure 5:
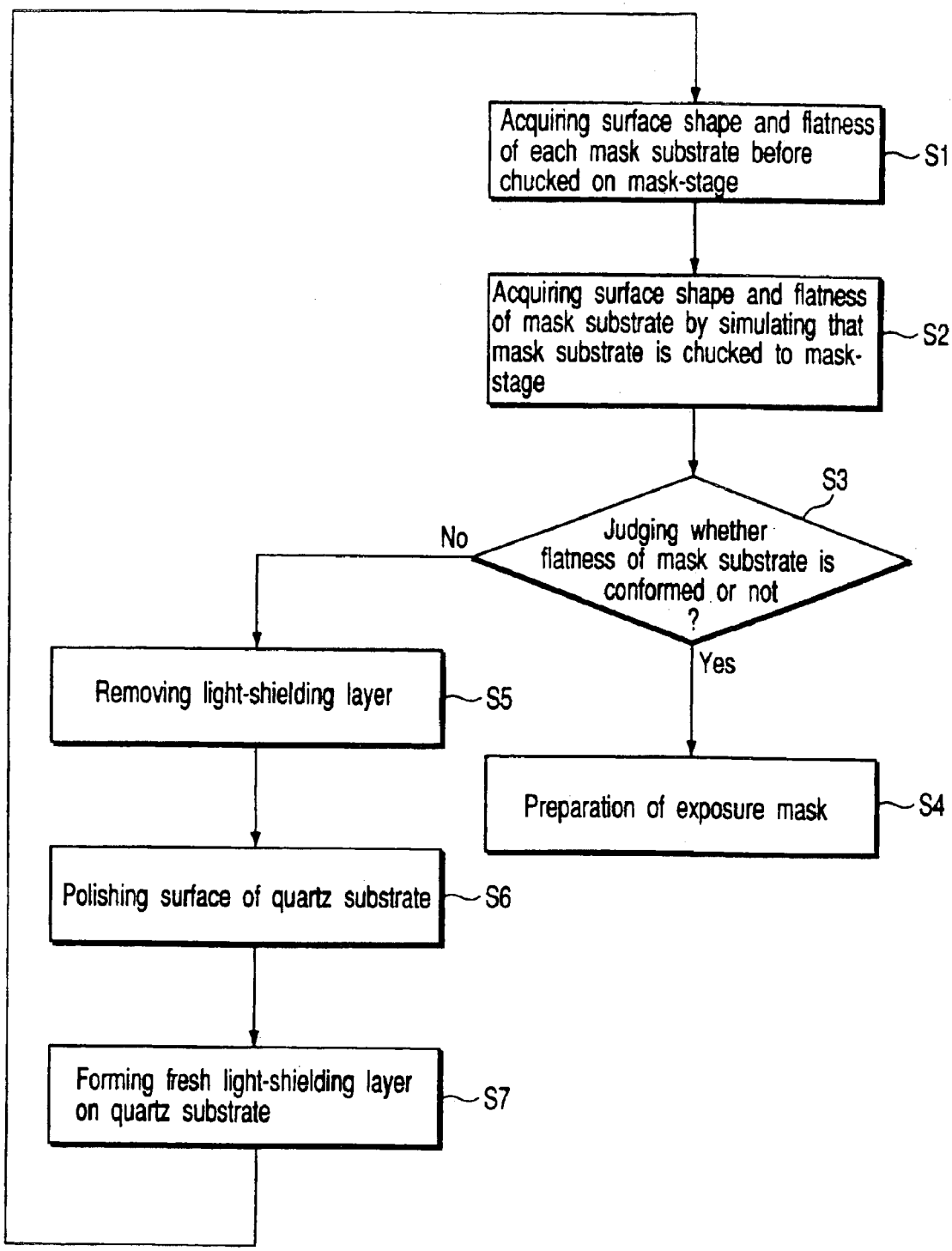
FIG. 5 is a flowchart showing the flow of a manufacturing method for an exposure mask according to a fourth embodiment of the present invention.

FIG. 5 is a flowchart showing the flow of a method of manufacturing an exposure mask pertaining to the this embodiment of the present invention.

First, in step S1, the surface shape of the surface of the mask substrate formed of a light shielding material layer on a quartz substrate of 152 mm square in size and about 6 mm in thickness was determined by measuring the flatness of the first region 1 (FIG. 2A) using the flatness measuring apparatus (Nidek).

Next, in step S2, the flatness and the surface shape of the surface of the mask substrate at the time when the mask substrate has been fixed by the vacuum chuck is acquired by utilizing a simulation, using a finite element method, based on the surface shape of the surface of the mask substrate acquired by step S1 and a structure of a mask chuck of the exposure apparatus.

In step S3, it is judged whether or not the flatness of the mask substrate is conformed to the specification. If it is judged that the flatness is conformed to the specification, then the process enters step S4 in which an exposure mask is formed.

On the other hand, in step S3 if it is judged that the flatness is not conformed to the specification, then the process enters step S5 in which the light-shielding material layer on the quartz substrate of the mask substrate is removed. Thereafter, the surface of the quartz substrate is polished in step S6. In step S7, a fresh light-shielding layer is formed on the polished surface of the quartz substrate, and the process goes back to step S1.

In this manner, as with the first embodiment, the second embodiment and the third embodiment, this embodiment realizes an effective manufacturing method for exposure mask in order to solve the disadvantage of degradation of product yield due to degradation of flatness of mask substrate after chucked on the mask stage of the wafer exposure apparatus.

The mask substrate may have a positioning mark formed in advance. Manner for chucking the mask substrate on the mask stage is not limited to vacuum chuck.

Also in this embodiment, for example, the wafer exposure apparatus may not be an ArF wafer exposure apparatus. Moreover, after the formation of a mask pattern, the flatness of the surface of the mask substrate may be further measured, and the surface shape of the surface of the mask substrate at the time when the mask substrate has been set on the exposure apparatus may be acquired by utilizing the simulation based on the measured data. Owing to this, the deformation of the surface of the mask substrate generated at the time when the mask pattern has been formed is incorporated into the acquisition results performed by the simulation, therefore, the surface shape of the surface of the mask substrate is capable of being detected with a higher precision. Further-more, the mask is not limited to a mask for ArF and a mask for KRF, for example, it can be also applied as a reflector type mask for vacuum ultraviolet ray exposure, a mask for x-ray exposure, a mask for electron beam exposure or the like.

(Fifth Embodiment)

A generating method for mask substrate information according to a fifth embodiment of the present invention will be explained below.

In the generating method for mask substrate information according to this embodiment, the surface shape of the surface and flatness of surface before and after chucked are acquired according to, for example, steps S1 to S3 of flow chart of FIG. 1 for each of eleven mask substrates A to K of Table 1, the correspondence of the mask substrate, surface shape type and flatness are made as shown in Table 1 for each of the eleven mask substrates A to K, and such correspondence is stored in a personal computer (PC) or the like.

Further, the correspondence (presentation content) stored in the personal computer (PC) or the like may be presented.

Specifically, a seal in which the presentation content is printed may be attached to a container holding the mask substrates A to K.

By employing such manner of presentation, it is easy to control the effective mask substrate for solving the problem of degradation of product yield due to gradation of flatness of mask substrate after chucked on the mask stage of the wafer exposure apparatus.

Further, after step S2 of flow chart of FIG. 1, of the information acquired at the step S2, the correspondence relation of information showing the convex surface shape of the surface and the corresponding mask substrate is made, and the correspondence is stored in the personal computer (PC) or the like, so that another different generating method for mask substrate information may be realized. In such a case, too, as in the above generating method for mask substrate information, by presenting the seal or the like regarding the correspondence, the mask substrate can be easily controlled.

The generating method for mask substrate information is explained by referring to an example of mask substrates to K in Table 1, however the mask substrate information can be similarly generating in mask substrates A to M in Table 2.

(Sixth Embodiment)

Figure 6:
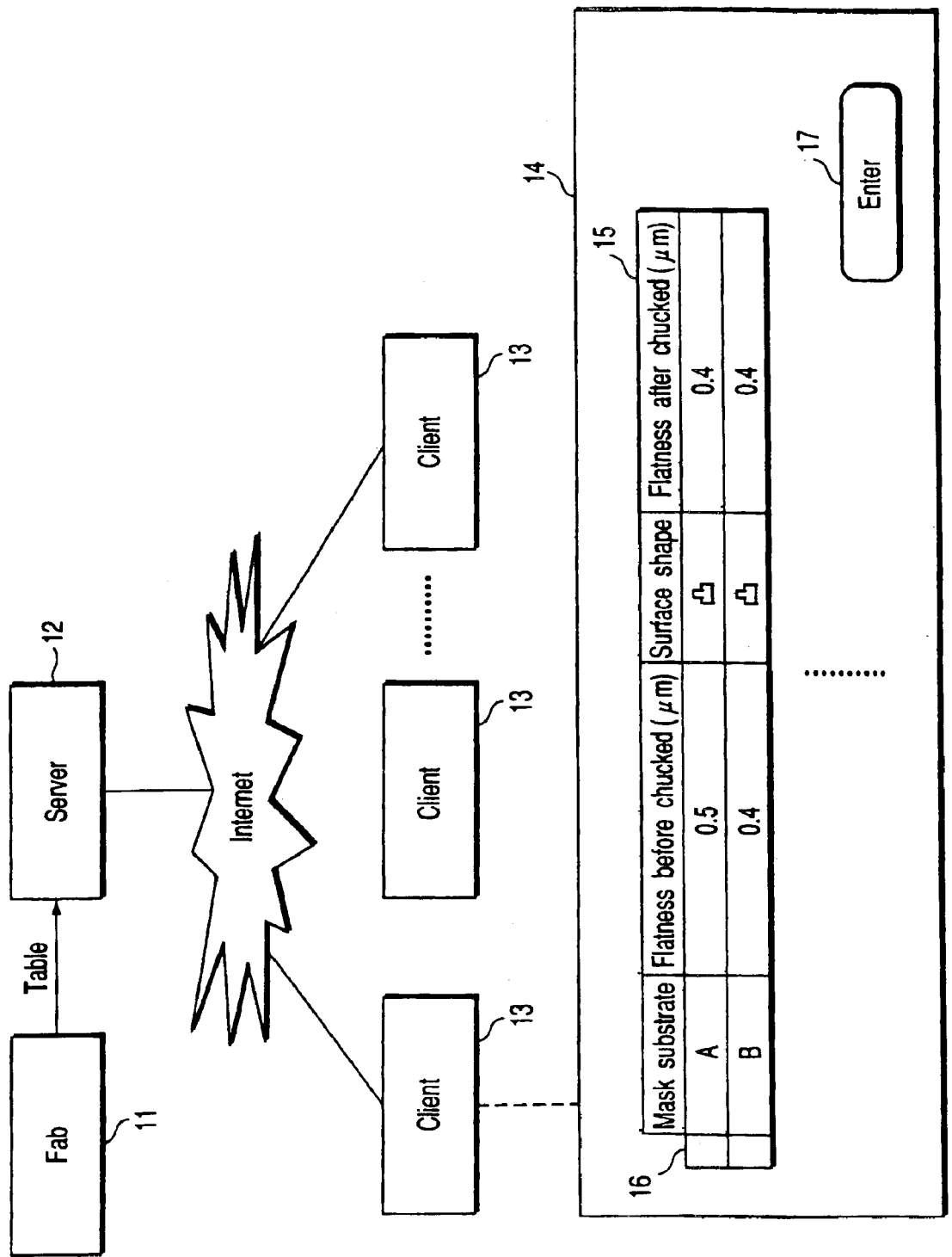
FIG. 6 is a system diagram schematically showing a server according to a sixth embodiment of the present invention.

FIG. 6 is a diagram schematically showing a server system according to a sixth embodiment of the invention. In the fifth embodiment, the seal is used as an example of presentation, but in this embodiment the information is presented on the server (server device), so that the generating method for mask substrate information of the invention may be applied in the so-called electronic-mail business.

First, a table such as Table 1, Table 2 or Table 3 showing the presentation content is formed at a fab 11, and a page containing the table as information is uploaded to a server 12. The server 12 stores the page in storage medium such as a hard disk.

The server 12 is connected to plural clients (client devices) 13 through the internet. Instead of the internet, an exclusive line may be used. Or the internet may be combined with an exclusive line.

The server 12 comprises a known processing device which processes acceptance of request message to the page, a known processing device which processes transmission of the page in a format that can be displayed at the client side, and a known processing device which processes acceptance of an application message of the substrate mask from the client 13 having the page transmitted. These known processing devices means are formed of, for example, LAN card, storage device, server software, CPU and others, and they cooperate to process as desired.

When accepting the request message to the page from the client 13, the server 12 sends the necessary information to the client 13 for displaying a screen 14 as shown in FIG. 3 in the display of the client 13. The screen 14 shows a table 15 having the content shown in Table 1, a check box 16 for selecting a desired mask substrate and checking, and an enter icon 17 for transmitting the execution of purchasing the mask substrate checked in the check box to the server 12. The diagram shows the table 15 having the content shown in Table 1 for the sake of simplicity, however, instead, a table having the content shown in Table 2 or Table 2 may be used.

With this embodiment, after chucking the mask substrate on the mask stage of the wafer exposure apparatus, a mask substrate of high flatness can be purchased, and it realizes an effective server for solving the problem of degradation of product yield due to degradation of flatness of mask substrate after chucked on the mask stage.

The preferred embodiments of the invention are described herein, however, it is noted that the invention is not limited to these embodiments. For example, although in the foregoing embodiments a favorable result was obtained in the mask substrate of convex shape, a better result may be obtained in the mask substrate of concave shape, depending on the exposure apparatus to which the mask substrate is set. That is, the flatness of the mask substrate after vacuum chuck depends on the interrelation between the mask chuck stage and mask chuck surface, and thus the surface shape of the mask substrate to be selected varies with the mask chuck stage to be used.

Further, in the embodiments, the mask substrate for ArF wafer exposure apparatus is explained, however the invention may be applied in other mask substrates, such as mask substrate for KrF wafer exposure apparatus, reflection type mask substrate for vacuum ultraviolet ray exposure, mask substrate for X-ray exposure, and mask substrate for electron beam exposure.

What is claimed is:

1. A method of testing a mask substrate comprising:

acquiring a first information showing a mask substrate and a surface shape of a surface of the mask substrate;

acquiring a second information showing a simulated flatness of the surface of the mask substrate after being chucked on a mask stage of an exposure apparatus obtained by simulation on the basis of a measured flatness of the surface of the mask substrate measured by a flatness measuring apparatus and a structure of a mask chuck of the exposure apparatus; and judging whether or not the simulated flatness of the surface of the mask substrate is conformed to a specification.

2. The method of testing a mask substrate according to claim 1, wherein the mask substrate comprises a base substrate having a surface and a light shielding material layer formed to cover the surface of the base substrate, and the surface of the base substrate has a surface shape in which a peripheral portion of the surface of the base substrate is lower in height than a central portion thereof toward a peripheral edge of the base substrate.

3. The method of testing a mask substrate according to claim 2, wherein part of the peripheral portion is a part to which a force for chucking the mask substrate on the mask stage of the exposure apparatus is applied.

4. The method of testing a mask substrate according to claim 1, wherein the mask substrate comprises a base substrate having a surface and a light shielding material layer formed to cover the surface of the base substrate, and the surface of the base substrate has a surface shape in which a central portion of the surface of the base substrate, which extends in a direction, is high and a peripheral portion of the surface of the base substrate, which extends in the direction at each side of the central portion thereof, is lowered in height toward a peripheral edge of the base substrate.

5. A method of manufacturing an exposure mask comprising:

acquiring a first information showing a mask substrate and a surface shape of a surface of the mask substrate;

acquiring a second information showing a simulated flatness of the surface of the mask substrate after being chucked on a mask stage of an exposure apparatus obtained by simulation on the basis of a measured flatness of the surface of the mask substrate measured by a flatness measuring apparatus and a structure of a mask chuck of the exposure apparatus;

judging whether or not the simulated flatness of the surface of the mask substrate is conformed to a specification; and processing the mask substrate to form an exposure mask if it is judged that the simulated flatness is conformed to the specification, wherein the mask substrate comprises a base substrate having a surface and a light shielding material layer formed on the surface of the base substrate, the surface of the base substrate has a surface shape in which a central portion of the surface of the base substrate, which extends in a direction, is high and a peripheral portion of the surface of the base substrate, which extends in the direction at each side of the central portion thereof, is lowered in height toward a peripheral edge of the base substrate, and edge portions of the central portion of the surface of the base substrate are chucked by the mask chuck.

6. A method of manufacturing a semiconductor device comprising:

chucking an exposure mask having a pattern, which is manufactured by an exposure mask manufacturing method, on a mask stage of an exposure apparatus;

illuminating the pattern of the exposure mask by a lighting optical system, and focusing the pattern to make an image of the pattern on a substrate by a projecting optical system; and patterning the substrate based on the image made on the substrate to form a corresponding pattern to form a semiconductor device, wherein the exposure mask manufacturing method comprises:

acquiring a first information showing a surface shape of a surface of each of a plurality of mask substrates, and a second information showing flatness of the surface of each of mask substrates after being chucked on a mask stage of an exposure apparatus obtained by simulation on the basis of flatness of the surface of each of the mask substrates measured by a flatness measuring apparatus and a structure of a mask chuck of the exposure apparatus;

forming a correspondence relation of each of the mask substrates, the first information, and the second information;

selecting one second information showing a desired flatness among the second information of the correspondence relations, and preparing a further mask substrate having the same surface shape as the surface shape shown by the first information which is in the correspondence relation including the selected second information; and forming a desired pattern on said further mask substrate.

7. A method of manufacturing a semiconductor device comprising:

chucking an exposure mask having a pattern, which is manufactured by an exposure mask manufacturing method, on a mask stage of an exposure apparatus;

illuminating the pattern of the exposure mask by a lighting optical system, and focusing the pattern to make an image of the pattern on a substrate by a projecting optical system; and patterning the substrate based on the image made on the substrate to form a corresponding pattern to form a semiconductor device, wherein the exposure mask manufacturing method comprises:

selecting, among second information of correspondence relations each between a first information showing a corresponding one of a plurality of mask substrates and a surface shape of a surface of the corresponding mask substrate and a second information showing flatness of the surface of the corresponding mask substrate after being chucked on a mask stage of an exposure apparatus obtained by simulation on the basis of flatness of the surface of the corresponding mask substrate measured by a flatness measuring apparatus and a structure of a mask chuck of the exposure apparatus, one such second information showing a desired flatness, and preparing a further mask substrate having the same surface shape as the surface shape shown by the first information which is in the correspondence relation including the selected second information; and forming a desired pattern on said further mask substrate.

8. A method of manufacturing a semiconductor device comprising:

chucking an exposure mask having a pattern, which is manufactured by an exposure mask manufacturing method, on a mask stage of an exposure apparatus;

illuminating the pattern of the exposure mask by a lighting optical system, and focusing the pattern to make an image of the pattern on a substrate by a projecting optical system; and patterning the substrate based on the image made on the substrate to form a corresponding pattern to form a semiconductor device, wherein the exposure mask manufacturing method comprises:

acquiring a first information showing a mask substrate and a surface shape of a surface of the mask substrate;

acquiring a second information showing a simulated flatness of the surface of the mask substrate after being chucked on a mask stage of an exposure apparatus obtained by simulation on the basis of a measured flatness of the surface of the mask substrate measured by a flatness measuring apparatus and a structure of a mask chuck of the exposure apparatus;

judging whether or not the simulated flatness of the surface of the mask substrate is conformed to a specification; and processing the mask substrate to form an exposure mask if it is judged that the simulated flatness is conformed to the specification.

9. The method of manufacturing a semiconductor device according to claim 8, wherein the mask substrate comprises a base substrate having a surface and a light shielding material layer formed to cover the surface of the base substrate, and the surface of the base substrate has a surface shape in which a peripheral portion of the surface of the base substrate is lower in height than a central portion thereof toward a peripheral edge of the base substrate.

10. The method of manufacturing a semiconductor device according to claim 9, wherein part of the peripheral portion is a part to which a force for chucking the mask substrate on the mask stage of the exposure apparatus is applied.

11. The method of manufacturing a semiconductor device according to claim 8, wherein the mask substrate comprises a base substrate having a surface and a light shielding material layer formed to cover the surface of the base substrate, and the surface of the base substrate has a surface shape in which a central portion of the surface of the base substrate, which extends in a direction, is high and a peripheral portion of the surface of the base substrate, which extends in the direction at each side of the central portion thereof, is lowered in height toward a peripheral edge of the base substrate.

12. A method of manufacturing a semiconductor device, comprising:

chucking an exposure mask on a mask stage of an exposure apparatus, in which the exposure mask comprises a base substrate having a pattern formed of a light shielding material layer formed to cover a surface of the base substrate, and the surface of the base substrate has a surface shape in which a central portion of the surface of the base substrate, which extends in a direction, is high and a peripheral portion of the surface of the base substrate, which extends in the direction at each side of the central portion thereof, is lowered in height toward a peripheral edge of the base substrate, and edge portions of the central portion of the surface of the base substrate are chucked on the mask stage;

illuminating the pattern formed on the exposure mask by a lighting optical system, and focusing the pattern to make an image of the pattern on a desired substrate by a projecting optical system; and patterning the desired substrate based on the image made on the desired substrate to form a corresponding pattern to form a semiconductor device.

13. A method of manufacturing an exposure mask comprising:

acquiring a first information showing a mask substrate and a surface shape of a surface of the mask substrate;

acquiring a second information showing a simulated flatness of the surface of the mask substrate after being chucked on a mask stage of an exposure apparatus obtained by simulation on the basis of a measured flatness of the surface of the mask substrate measured by a flatness measuring apparatus and a structure of a mask chuck of the exposure apparatus;

judging whether or not the simulated flatness of the surface of the mask substrate is conformed to a specification; and processing the mask substrate to form an exposure mask if it is judged that the simulated flatness is conformed to the specification, wherein the mask substrate comprises a base substrate having a surface and a light shielding material layer formed to cover the surface of the base substrate, and the surface of the base substrate has a surface shape in which a peripheral portion of the surface of the base substrate is lower in height than a central portion thereof toward a peripheral edge of the base substrate.

14. The method of manufacturing an exposure mask according to claim 13, wherein part of the peripheral portion is a part to which a force for chucking the mask substrate on the mask stage of the exposure apparatus is applied.

15. The method of manufacturing an exposure mask according to claim 14, wherein the mask substrate comprises a base substrate having a surface and a light shielding material layer formed to cover the surface of the base substrate, and the surface of the base substrate has a surface shape in which a central portion of the surface of the base substrate, which extends in a direction, is high and a peripheral portion of the surface of the base substrate, which extends in the direction at each side of the central portion thereof, is lowered in height toward a peripheral edge of the base substrate.

* * * * *

UNITED STATES PATENT AND TRADEMARK OFFICE
CERTIFICATE OF CORRECTION

| | |
|---|---|
| PATENT NO. | : 7,060,519 B2 |
| APPLICATION NO. | : 10/756347 |
| DATED | : June 13, 2006 |
| INVENTOR(S) | : Itoh |

Page 1 of 1

It is certified that error appears in the above-identified patent and that said Letters Patent is hereby corrected as shown below:

Claims 6-12 (column 17, line 19 - column 19, line 23), delete in their entirety.

Renumber Claim 13 as Claim 6.

Renumber Claim 14 as Claim 7.

Renumber Claim 15 as Claim 8.

Signed and Sealed this

Twenty-fourth Day of October, 2006

JON W. DUDAS
*Director of the United States Patent and Trademark Office*